United States Patent
Lyu et al.

[11] Patent Number: 6,001,539
[45] Date of Patent: Dec. 14, 1999

[54] METHOD FOR MANUFACTURING LIQUID CRYSTAL DISPLAY

[75] Inventors: Ki-Hyun Lyu, Anyang-shi; Hoo-Young Lee, Seoul, both of Rep. of Korea

[73] Assignee: LG Electronics, Inc., Seoul, Rep. of Korea

[21] Appl. No.: 08/831,717

[22] Filed: Apr. 1, 1997

Related U.S. Application Data

[63] Continuation-in-part of application No. 08/826,804, Mar. 25, 1997.

[30] Foreign Application Priority Data

Apr. 8, 1996 [KR] Rep. of Korea .................. 96/10414

[51] Int. Cl.$^6$ .................................................. G02F 1/1333
[52] U.S. Cl. ..................... 430/317; 430/319; 430/321; 216/23
[58] Field of Search ..................... 430/321, 317, 430/319; 349/43, 122, 138; 216/23

[56] References Cited

U.S. PATENT DOCUMENTS

| | | | |
|---|---|---|---|
| 4,636,038 | 1/1987 | Kitahara et al. | 350/339 |
| 5,229,644 | 7/1993 | Wakai et al. | 257/749 |
| 5,641,974 | 6/1997 | den Boer et al. | 257/59 |

FOREIGN PATENT DOCUMENTS

| | | |
|---|---|---|
| 0500117 | 8/1992 | European Pat. Off. . |
| 63-279228 | 11/1988 | Japan . |
| 63-289965 | 11/1988 | Japan . |
| 4-068318 | 3/1992 | Japan . |
| 4-163528 | 6/1992 | Japan . |

OTHER PUBLICATIONS

M.J. Radler et al., Cyclotene™ Advanced Electronics Resins for High–Aperture AMLCD Applications, SID 96 Applications Digest, pp. 33–36 (1996).

D.J. Perettie et al., Benzocyclobutene as a Planarization Overcoat for Flat Panel Displays, Asia Display '95, pp. 721–724 (1995).

Koji Kishimoto, Low–dielectric–constant interlayer insulating film and its manufacturing method, Electronic Journal, pp. 33–35 (Mar. 1996).

Toshihara Ueki et al., Dye embedded BM resin and three dimensional picture element implemented by BM ON ARRAY technology for the first time, Nikkei Microdevices, pp. 60–62 (Jul. 1994).

Radler, M.J., et al., "Benzocyclobutene Dielectric Resins for Flat Panel Display Applications," *Proceedings of the 3rd Annual Display Manufacturing Technology Conference*, pp. 123–124, 1996 (Conference date: Feb. 6–8, 1996).

Abstract of JP 5–166976, Koya (Jul. 1993).
Abstract of JP 4–225320, Takei (Aug. 1992).

*Primary Examiner*—John A. McPherson
*Attorney, Agent, or Firm*—Morgan, Lewis & Bockius LLP

[57] ABSTRACT

A method of manufacturing an LCD on a substrate, the method comprising the steps of forming a thin film transistor on the substrate; forming an organic passivation layer over the thin film transistor; forming a patterned photoresist over the organic passivation layer; etching the organic passivation layer to form a contact hole over one of source and drain of the transistor; removing the photoresist; forming an $SiO_2$ layer at a surface of the organic passivation layer by $O_2$ ashing; and forming a pixel electrode contacting one of the source and drain of the transistor through the contact hole.

12 Claims, 5 Drawing Sheets

METHOD FOR MANUFACTURING LIQUID CRYSTAL DISPLAY

CROSS REFERENCE TO RELATED APPLICATION

This application is a continuation-in-part of U.S. patent application Ser. No. 08/826,804 entitled "LIQUID CRYSTAL DISPLAY AND METHOD FOR MANUFACTURING THE SAME," filed on Mar. 25, 1997, the content of which is relied upon and incorporated by reference.

BACKGROUND OF THE INVENTION

1. Field of the Invention

The present invention relates to a method for manufacturing a liquid crystal display (LCD), and more particularly, to a method for manufacturing an LCD having a thin film transistor (TFT) as a switching element.

2. Discussion of the Related Art

In an LCD having TFTs as switching elements, the TFTs are integrated so as to drive and control each pixel. As shown in FIG. 1, in a conventional LCD having a TFT array, almost rectangular pixel electrodes 12 are arranged in rows and columns on a substrate 11. Gate lines 13 are formed along the rows and data lines 14 are formed along the columns.

FIG. 2A is a plan view showing a part of LCD elements in the LCD having a TFT array. As shown in FIG. 2A, a gate electrode 23 is formed on the substrate 11 and a plurality of data lines 14 perpendicularly crossing gate lines 13 are formed in parallel with each other. TFTs are formed near each crossing point of the gate line 13 and the data line 14.

FIG. 2B is a cross-sectional view taken along line I—I in FIG. 2A. As shown in FIG. 2B, a gate electrode 23 made of Ta is formed on the substrate 11. A gate insulating layer 21 made of $SiN_x$ is formed on the whole surface of the substrate including the gate electrode 23, and a semiconductor layer 22 made of a-Si is formed on the gate insulating layer 21. An ohmic contact layer 33 made of $n^+$ a-Si is formed on the semiconductor layer. Source and drain electrodes 24, 34 made of Mo are formed on the ohmic contact layer 33. Then, an organic layer 10 made of organic material is formed as a passivation layer.

The organic material has a smoother surface profile than inorganic materials. Therefore, when the organic material is deposited on the surface of the LCD, which has an uneven surface profile due to the multi-layered elements, the stepped surface can be flattened. Thus, defects such as non-uniform orientation condition or misalignment of liquid crystal molecules due to the stepped surface can be reduced. Also, a higher aperture ratio can be obtained by increasing the area of pixel electrodes.

Next, an inorganic insulating layer 15 made of $SiO_2$ or $SiN_x$ is formed on the organic insulating layer 10. A contact hole is formed and finally, a pixel electrode 12 made of a transparent conductive material such as ITO is formed.

As described above, the passivation layer of the conventional LCD has a layered structure having organic and inorganic insulating layers 10, 15. The inorganic insulating layer 15 is formed over the organic passivation layer in order to assist the adhesion property of the ITO layer onto the passivation layer. This is because the organic passivation layer does not provide a good adhesion to the ITO layer.

There are two ways of forming the organic and inorganic insulating layers. One is to sequentially deposit the organic and inorganic insulating layers and pattern them simultaneously. The other is to deposit and pattern the organic insulating layer first and then form the inorganic insulating layer.

First, the former has the following problem. The process of patterning the organic and inorganic insulating layers includes utilizing an organic solution, such as a mixture of N-Methyl-Pyrolidone ("NMP"), alcohol, and amine, to remove the photoresist. Then the insulating layer may swell or expand because such an organic solution can penetrate through the interface between the organic passivation layer and the inorganic insulating layer.

Second, the latter also has a problem in that two patterning steps are needed for forming the insulating layer. In addition, the drain electrode may be disconnected because the difference in thermal expansion coefficients between the organic and inorganic insulating layers may produce cracks in the contact hole area.

SUMMARY OF THE INVENTION

Accordingly, the present invention is directed to a method for manufacturing a liquid crystal display, that substantially obviates one or more of the problems due to limitations and disadvantages of the related art.

An object of the present invention is to provide a method for manufacturing a TFT, that is free from the above mentioned problems.

Additional features and advantages of the invention will be set forth in description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a liquid crystal display includes the steps of forming gate lines, data lines and a TFT array on a substrate, depositing an organic insulating layer to cover the above mentioned elements including the TFT array, coating a photoresist on the organic passivation layer, developing the photoresist, etching the organic passivation layer along the developed pattern of the photoresist, removing the photoresist and converting the surface of the organic passivation layer into $SiO_2$ by ashing with $O_2$, depositing an ITO layer, a transparent conductive layer, coating and developing a photoresist, forming a pixel electrode by etching the ITO layer along the developed pattern of the photoresist and removing the photoresist by ashing with $O_2$.

In another aspect, the LCD according to the present invention includes a substrate, gate lines formed on the substrate, a gate insulating layer covering the gate lines, a semiconductor layer formed on the gate insulating layer, source and drain electrodes formed on the semiconductor layer, an organic passivation layer covering the whole surface of the substrate including the source and drain electrodes, an inorganic insulating layer formed by converting the surface of the organic passivation layer into $SiO_2$ by ashing with $O_2$, contact holes formed in the insulating layer located over the drain electrodes and pixel electrodes formed on the inorganic insulating layer, each pixel electrode being connected with the drain electrode through the contact hole.

In another aspect, the LCD with a stagger type TFT array according to the present invention includes a substrate, source and drain electrodes formed on the substrate, a semiconductor layer formed on the source and drain electrodes, a gate insulating layer formed on the semiconductor layer, gate electrodes formed on the gate insulating layer, an organic passivation layer covering the whole surface of the substrate including the gate electrodes, an inorganic insulating layer formed by making the surface of the organic passivation layer into $SiO_2$, contact holes in the insulating layers located over the drain electrodes and pixel electrodes formed on the inorganic insulating layer, each pixel electrode being connected with the drain electrode through the contact hole.

In another aspect, a method of manufacturing an LCD on a substrate includes the steps of forming a thin film transistor on the substrate; depositing an organic passivation layer over the thin film transistor; forming a patterned photoresist over the organic passivation layer; etching the organic passivation layer to form a contact hole over one of source and drain of the transistor; removing the photoresist; forming an $SiO_2$ layer at a surface of the organic passivation layer by $O_2$ ashing; and forming a pixel electrode contacting one of the source and drain of the transistor through the contact hole.

In another aspect, a method of manufacturing an LCD on a substrate, the method comprising the steps of forming a transistor having a gate, a gate insulating layer, a source, and a drain on the substrate; forming a data line connected to the source of the transistor; forming a gate line connected to the gate of the transistor; forming an organic passivation layer over the transistor, the passivation layer including at least one of fluorinated polyimide, teflon, cytop, fluoropolyarylether, fluorinated parylene, PFCB (perfluorocyclobutane), and BCB (benzocyclobutene); and performing a plasma treatment on the passivation layer using a gas including oxygen.

In a further aspect, a method of manufacturing an LCD on a substrate, the method comprising the steps of forming a thin film transistor having a gate, a gate insulating layer, a source, and a drain on the substrate; forming a data line connected to the source of the transistor; forming a gate line connected to the gate of the transistor; forming an organic passivation layer over the thin film transistor, the organic passivation layer including one of fluorinated polyimide, teflon, cytop, fluoropolyarylether, fluorinated parylene, PFCB (perfluorocyclobutane), and BCB (benzocyclobutene); forming a patterned photoresist over the organic passivation layer; etching the organic passivation layer to form a contact hole over one of the source and the drain of the transistor; removing the photoresist; forming an $SiO_2$ layer at a surface of the organic passivation layer by $O_2$ ashing; and forming a pixel electrode contacting one of the source and the drain of the thin film transistor through the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
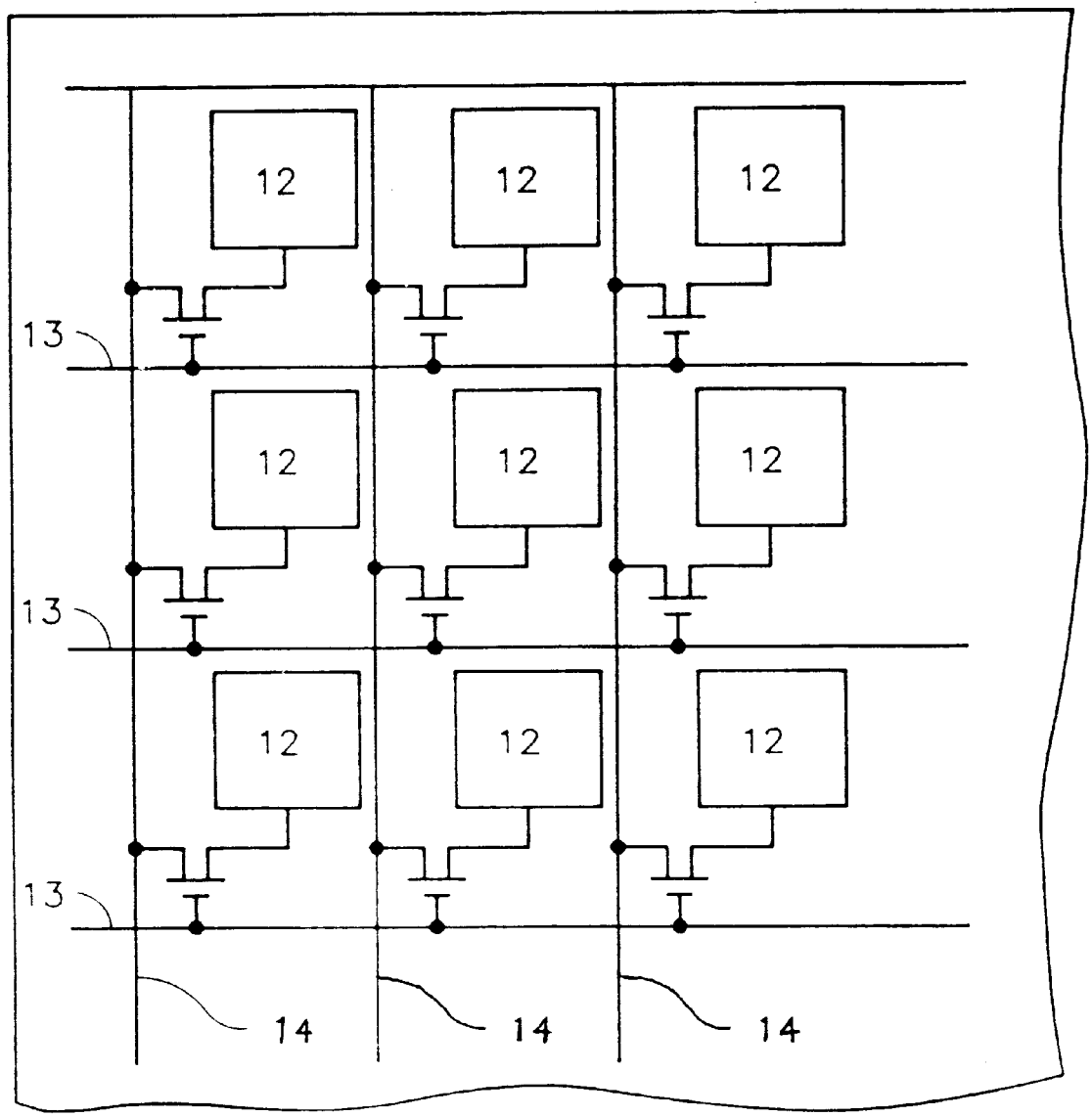
FIG. 1 is a circuit diagram of a conventional LCD.
Figure 2A:
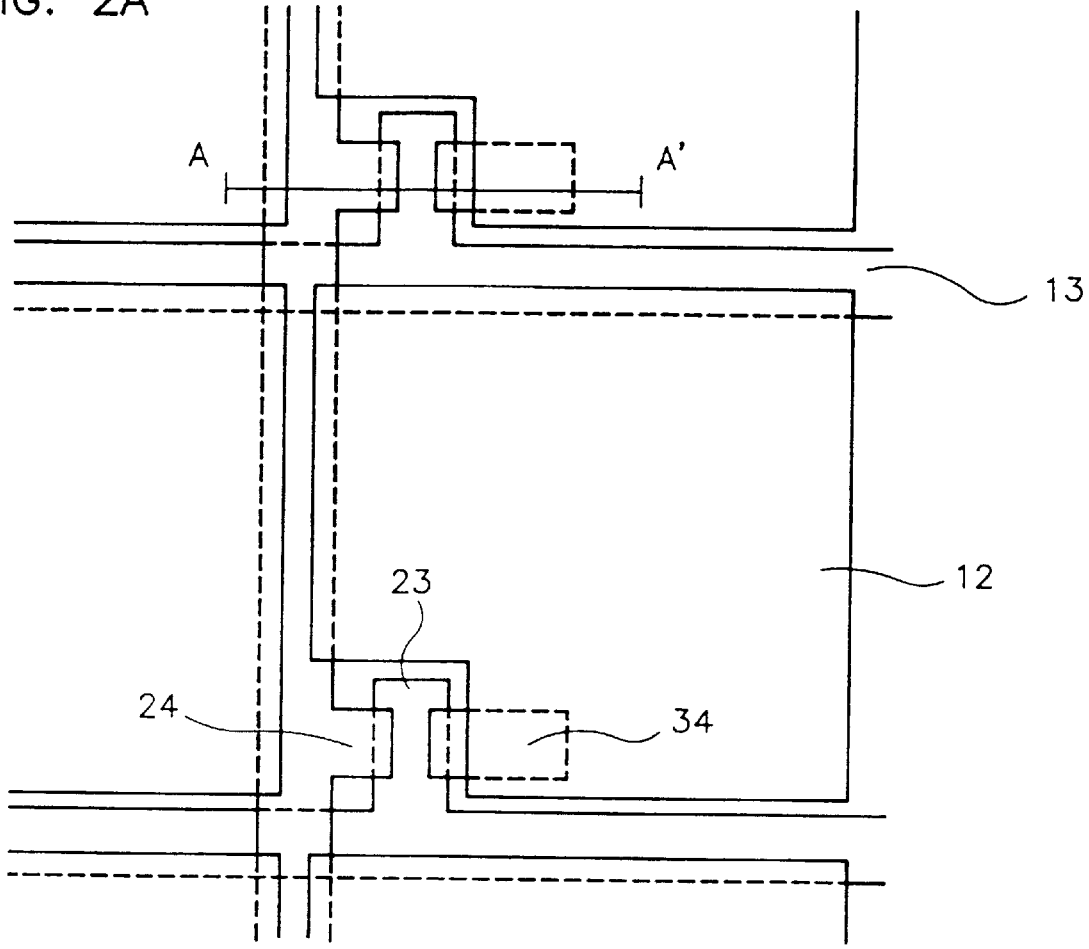
FIG. 2A is an enlarged plan view showing TFTs and parts of pixel electrodes in the conventional LCD.
Figure 2B:
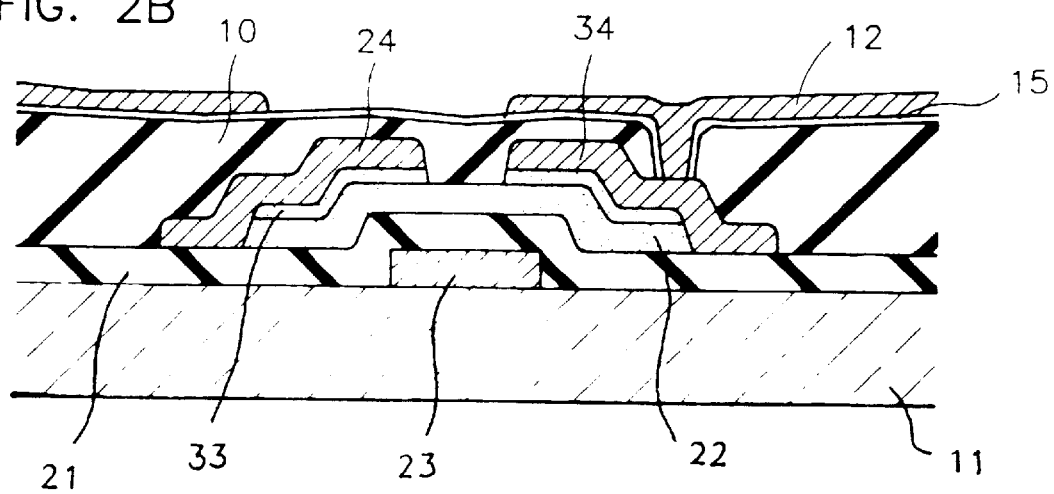
FIG. 2B is a cross-sectional view taken along line I—I of FIG. 2A.

Reference will now be made in detail to the preferred embodiments of the present invention, examples of which are illustrated in the accompanying drawings.

First Preferred Embodiment

As shown in FIG. 3, a metal such as aluminum is deposited on the whole surface of a substrate 111 and patterned to form a gate line and a gate electrode 123. A gate insulating layer 121 is deposited on the whole surface of the substrate on which the metal layer has been already patterned (FIG. 3A). An a-Si layer 122 and an n⁺ a-Si layer 133 are deposited (FIG. 3B) and patterned to form a-Si layer 122 and an n⁺ a-Si layer 133 (FIG. 3C). A Cr layer, for example, is deposited and patterned to form a source electrode 124 and a drain electrode 134. Then, the exposed portion of the n⁺ a-Si layer 133 is etched (FIG. 3D).

Figure 3A:
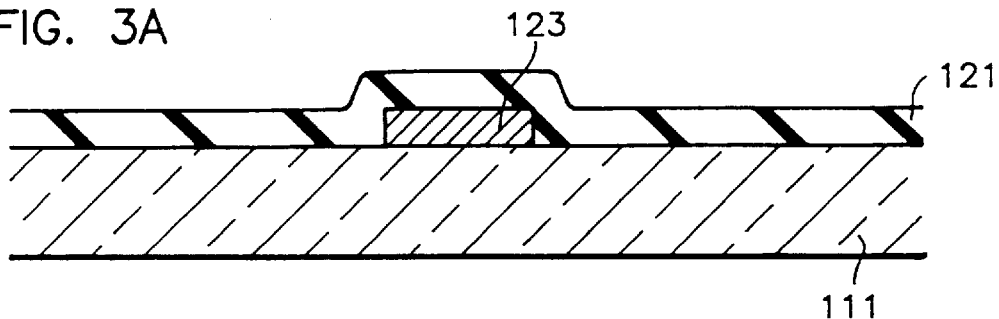
FIGS. 3A to 3F are cross-sectional views showing a method for manufacturing an LCD according to a first embodiment of the present invention.
Figure 3B:
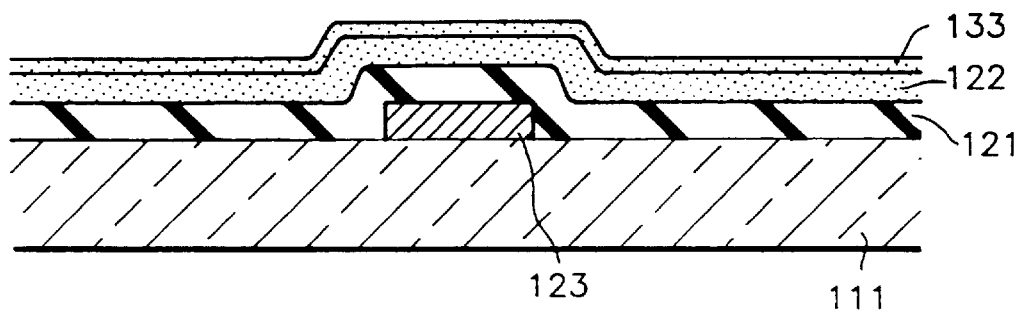
Figure 3C:
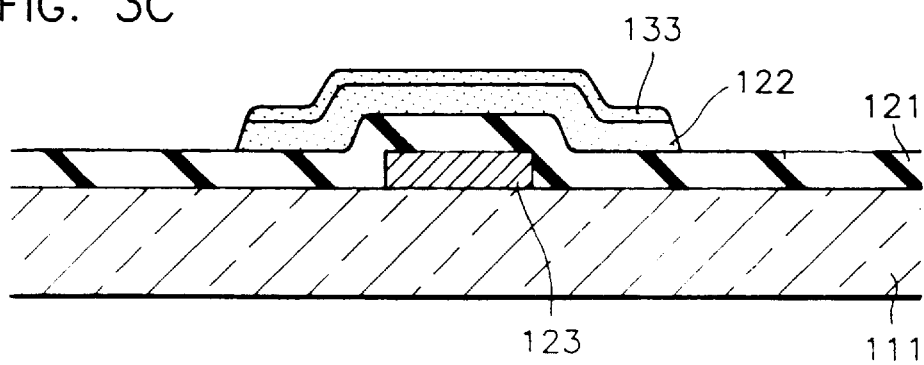
Figure 3D:
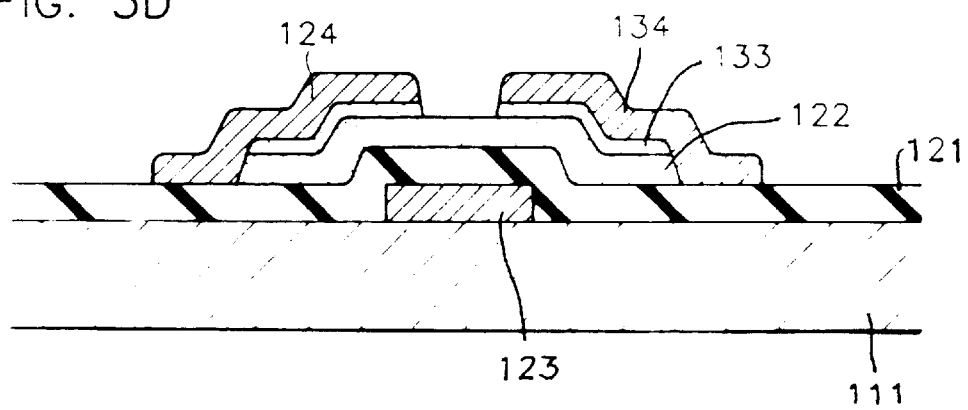
Figure 3E:
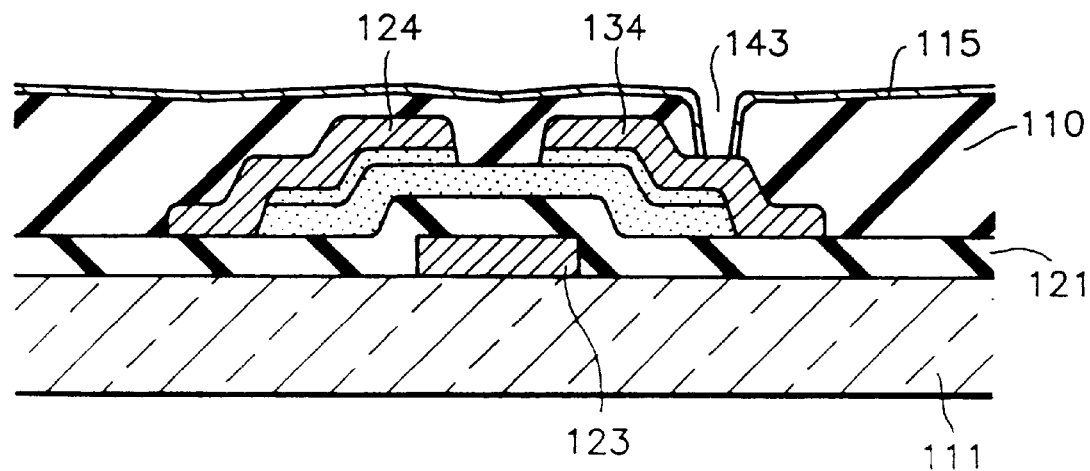

Referring to FIG. 3E, passivation layer 110 is formed on the whole surface by depositing an organic material having an

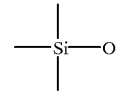

bond structure. A photoresist is coated on the passivation layer and developed. A contact hole 143 is formed using a dry-etching method, for example. The photoresist is removed by $O_2$ ashing. An inorganic insulating layer 115 is converted by oxidizing the surface of the organic passivation layer into $SiO_2$ (FIG. 3E). If the organic passivation layer covers the gate and data line pads, it could be simultaneously etched when the contact hole is formed by using the dry-etching method (not shown in the drawings).

Figure 3F:
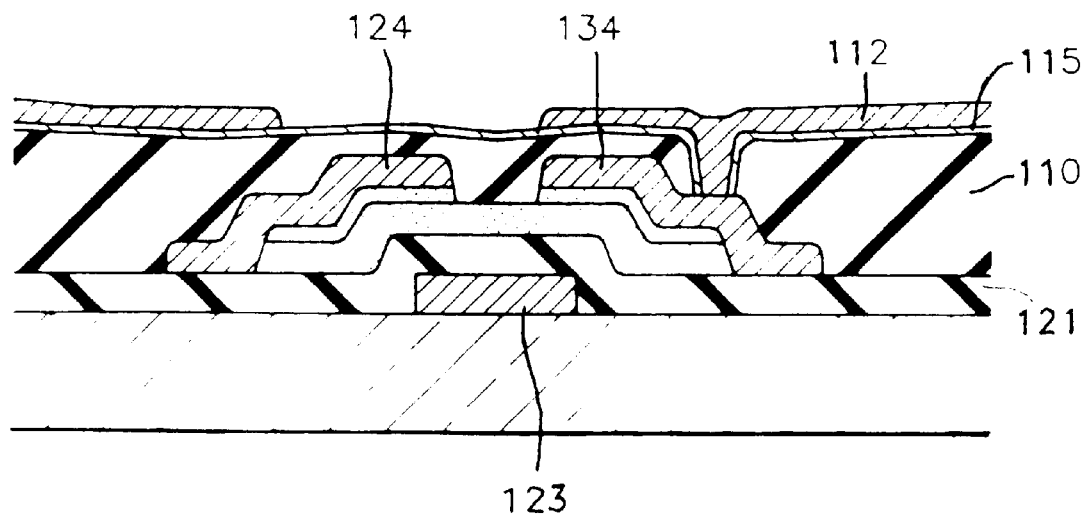

Next, referring to FIG. 3F, an ITO layer is deposited. A photoresist is coated and developed. A pixel electrode 112 is formed by etching the ITO layer according to the developed pattern of the photoresist. The remaining photoresist could be removed by $O_2$ ashing (FIG. 3F).

Second Preferred Embodiment

Figure 4A:
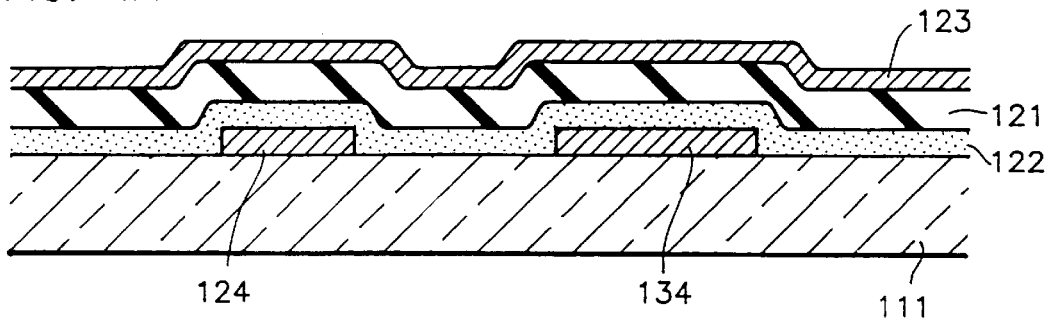
FIGS. 4A to 4D are cross-sectional views showing a method for manufacturing an LCD according to a second embodiment of the present invention.
Figure 4B:
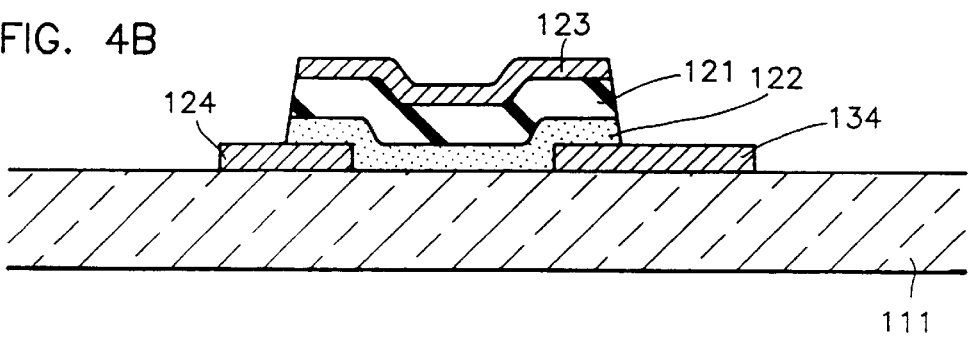

Referring to FIG. 4A, a metal such as Cr is deposited on a whole surface of a substrate 111 and patterned to form a data line, a source electrode 124, and a drain electrode 134. An a-Si layer, an SiN$_x$ layer, and an Al layer are deposited on the whole surface of the substrate on which the Cr layer has been already patterned (FIG. 4A). These layers are patterned to form a semiconductor layer 122, a gate insulating layer 121, a gate line, and a gate electrode 123 (FIG. 4B).

A passivation layer 110 is formed by depositing an organic material on the whole surface having an

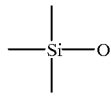

bond structure. Many different compounds having the

Figure 4C:
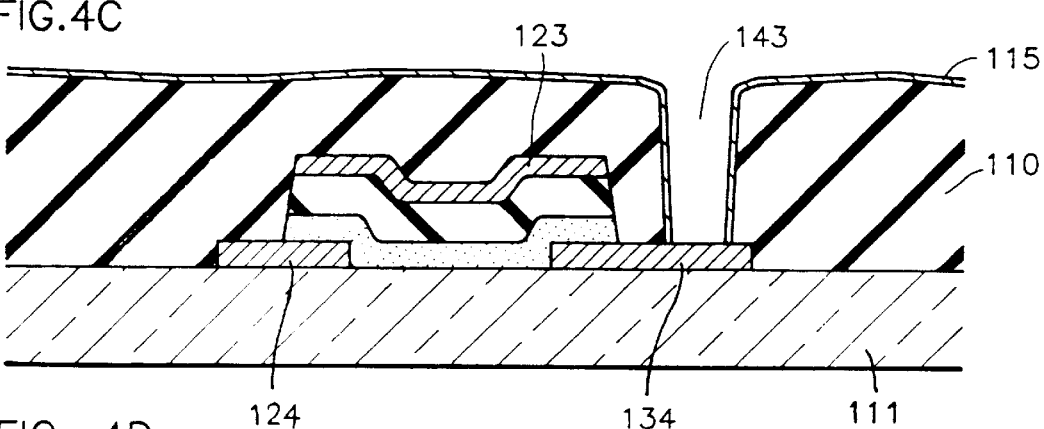

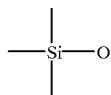

chemical bond are contemplated in the present invention. An example of such compounds includes benzocyclobutene (BCB). A photoresist is coated on the passivation layer and developed. A contact hole 143 is formed using a dry-etching method, for example. The photoresist is removed by O$_2$ ashing. An inorganic insulating layer 115 is formed by continuously ashing with O$_2$ for a certain period of time and converting the surface of the organic passivation layer 110 into an SiO$_2$ layer (FIG. 4C). If an organic passivation layer covers the gate and data line pads, it could be simultaneously etched when the contact hole is formed by using a dry-etching method (not shown in the drawings).

Figure 4D:
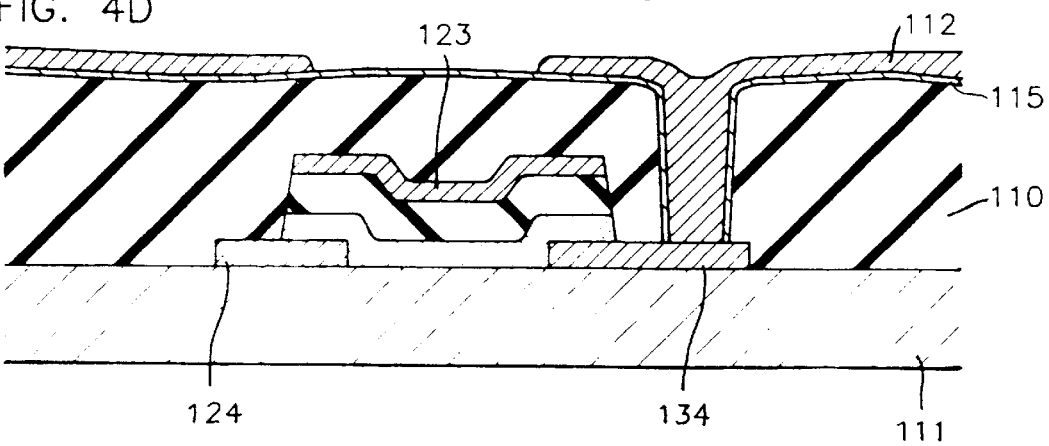

Referring to FIG. 4D, an ITO layer is deposited. A photoresist is coated and developed. The pixel electrode 112 is formed by dry-etching or wet-etching the ITO layer according to the developed pattern of the photoresist. The remaining photoresist could be removed by ashing with O$_2$ (FIG. 4D).

The characteristics of the above mentioned methods according to the present invention is described below. The photoresist is coated on an organic passivation layer. The photoresist is exposed and developed into a desired pattern by using a mask. The organic passivation layer is patterned according to the developed pattern of the photoresist by using a dry-etching method. The remaining photoresist is removed by O$_2$ ashing or using a wet-etching method (wet-strip). In the case of using O$_2$ ashing, an inorganic insulating layer 115 can be formed by continuously ashing the organic passivation layer with O$_2$ for a certain period of time thereby converting the surface of the organic passivation layer into SiO$_2$. Accordingly, the three steps of (1) etching the organic insulating layer, (2) removing the photoresist, and (3) ashing the organic passivation layer with O$_2$ can be sequentially performed in a dry-etching chamber at once. Thus, since the three steps are sequentially performed in a dry-etching chamber at once, the number of process steps are reduced in the present invention Alternatively, the photoresist can be removed by using a wet-etching (wet-strip method). In this case, a mixture of alcohol, acetone, H$_2$SO$_4$ and HNO$_3$ may be used as a solution in the wet-strip method among various methods for removing the photoresist. Then, an inorganic insulating layer can be formed on the organic passivation layer by converting the surface of an organic passivation layer 110 to an SiO$_2$ layer by ashing with O$_2$ after the photoresist on the organic passivation layer is removed.

Also, the undesirable swelling of the insulating layer in the conventional method caused by the penetration of an organic solution such as a mixture of NMP, alcohol, and amine through the interface between the organic passivation layer and the inorganic insulating layer can be prevented, because the inorganic insulating layer is formed by converting the surface of the organic passivation layer to an SiO$_2$ layer.

Moreover, the SiC$_2$ layer over the insulating layer according to the present invention prevents the problem of the disconnection or detachment between the pixel and drain electrodes which is caused by cracks in the contact hole area resulting from a difference in thermal expansion coefficients between the organic and inorganic insulating layers. Such difference in thermal expansion coefficient is overcome by the present invention.

It will be apparent to those skilled in the art that various modifications and variations can be made in the method for manufacturing a liquid crystal display of the present invention without departing from the spirit or scope of the invention. Thus, it is intended that the present inventions cover the modifications and variations of this invention provided they come within the scope of the appended claims and their equivalents.

What is claimed is:

1. A method of manufacturing an LCD on a substrate, the method comprising the steps of:

forming a thin film transistor on the substrate;

forming an organic insulating layer over the thin film transistor;

forming a patterned photoresist over the organic insulating layer;

etching the organic insulating layer to form a contact hole over one of source and drain of the transistor;

removing the photoresist by O$_2$ ashing;

continuously performing the O$_2$ ashing in such a way as to form an inorganic layer at a surface of the organic insulating layer, the inorganic layer having a thermal expansion coefficient consistent with that of the organic insulating layer to prevent cracks that may be generated adjacent the contact hole; and forming a pixel electrode contacting one of the source and drain of the transistor through the contact hole.

2. The method of manufacturing an LCD according to claim 1, wherein the organic insulating layer includes at least Si bond structure.

3. The method of manufacturing an LCD according to claim 1, wherein the steps of etching the organic insulating layer, removing the photoresist by O$_2$ ashing, and continuously performing the O$_2$ ashing are sequentially performed in a dry etching chamber.

4. A method of manufacturing an LCD on a substrate, the method comprising the steps of:

forming a transistor having a gate, a gate insulating layer, a source, and a drain on the substrate;

forming a data line connected to the source of the transistor;

forming a gate line connected to the gate of the transistor;

forming a passivation layer over the transistor, the passivation layer including an organic layer having at least Si-bond structure; and performing a plasma treatment on the passivation layer using a gas including oxygen to convert a surface of the passivation layer into an inorganic insulating layer in such a way that the inorganic insulating layer has a thermal expansion coefficient consistent with that of the passivation layer to prevent generation of cracks.

5. The method of manufacturing an LCD according to claim 4, wherein the step of performing the plasma treatment forms a silicon oxide at a surface of the passivation layer.

6. A method of manufacturing an LCD on a substrate, the method comprising the steps of:

forming a thin film transistor having a gate, a gate insulating layer, a source, and a drain on the substrate;

forming a data line connected to the source of the thin film transistor;

forming a gate line connected to the gate of the thin film transistor;

forming an organic insulating layer over the thin film transistor, the organic insulating layer including an organic layer having at least Si-bond structure;

forming a patterned photoresist over the organic insulating layer;

etching the organic insulating layer to form a contact hole over one of the source and the drain of the thin film transistor;

removing the photoresist;

forming an inorganic layer at a surface of the organic insulating layer by $O_2$ ashing in such a way that the inorganic layer has a thermal expansion coefficient consistent with that of the organic insulating layer to prevent cracks that may be generated adjacent the contact hole; and forming a pixel electrode contacting one of the source and the drain of the thin film transistor through the contact hole.

7. The method of manufacturing an LCD according to claim 6, wherein the step of removing the photoresist includes $O_2$ ashing.

8. The method of manufacturing an LCD according to claim 7, wherein the $O_2$ ashing step is carried out continuously until the photoresist is removed and the inorganic layer is formed at the surface of the organic insulating layer.

9. The method of manufacturing an LCD according to claim 8, wherein the steps of etching the organic insulating layer, removing the photoresist, and forming the inorganic layer are sequentially performed in a dry etching chamber.

10. The method of manufacturing an LCD according to claim 6, the step of forming the inorganic layer includes the step of converting the surface of the organic insulating layer to $SiO_2$ by $O_2$ ashing.

11. The method of manufacturing an LCD according to claim 6, wherein the step of removing the photoresist includes a wet-etching method.

12. The method of manufacturing an LCD according to claim 11, wherein the wet-etching method uses a mixture of alcohol, acetone, $HNO_3$ and $H_2SO_4$.

* * * * *